United States Patent
Beausoleil et al.

(10) Patent No.: US 6,469,375 B2
(45) Date of Patent: Oct. 22, 2002

(54) HIGH BANDWIDTH 3D MEMORY PACKAGING TECHNIQUE

(76) Inventors: William F. Beausoleil, 21 Bykenhulle Rd., Hopewell Junction, NY (US) 12533; Edmund D. Blackshear, 295 Cedar Hill Rd., Wappingers Falls, NY (US) 12590; Michael J. Ellsworth, Jr., 5 Scott La., Lagrangeville, NY (US) 12540; William F. Shutler, 18 Dogwood Hill Rd., Wappingers Falls, NY (US) 12590; Norton J. Tomassetti, 169 Parsell St., Kingston, NY (US) 12401

( * ) Notice: Subject to any disclaimer, the term of this patent is extended or adjusted under 35 U.S.C. 154(b) by 0 days.

(21) Appl. No.: 09/796,055

(22) Filed: Feb. 28, 2001

(65) Prior Publication Data

US 2002/0117741 A1 Aug. 29, 2002

(51) Int. Cl.[7] .............................................. H01L 23/02
(52) U.S. Cl. ........................ 257/686; 257/723; 257/700; 257/713; 257/712; 257/737; 257/758; 361/790; 361/735; 361/764; 361/803
(58) Field of Search .............................. 257/686, 774, 257/684, 685, 723, 777, 758, 773, 775, 786, 750, 734, 737, 738, 781

(56) References Cited

U.S. PATENT DOCUMENTS 5,239,448 A * 8/1993 Perkins et al. ............... 257/686
5,579,207 A * 11/1996 Hayden et al. .............. 257/786
5,995,379 A * 11/1999 Kyougoku et al. .......... 257/686

* cited by examiner

Primary Examiner—Tom Thomas
Assistant Examiner—Patricia M. Costanzo

(57) ABSTRACT

A three-dimensional memory module in a repetitively used pedestal connector provides signal paths unique and common to the module at its level and signal paths from the level below unique to and common to modules at levels above. In order to provide a unique signal path from a substrate to each memory module, while using identical pedestal connectors at each level, signal lines are skewed from where they enter the bottom surface of the pedestal connector to where they exit the top surface. For example, each input in a line of inputs is connected to a matching line of outputs, but with a shift of one position between input and output.

3 Claims, 5 Drawing Sheets

GRID POSITION

HIGH BANDWIDTH 3D MEMORY PACKAGING TECHNIQUE

FIELD OF THE INVENTION

This invention relates to a pedestal connector for densely packing memory modules and other electronic modules in a multi-module, three-dimensional stack, and more particularly to a stack of pedestal connectors that has a novel connector pattern, repeated in each pedestal connector, to provide conductive paths both unique and common to each memory module.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

In certain applications, such as high performance emulator applications, it is desirable to have a large memory capacity comprised of chips or off-the-shelf memory modules with high-speed, wide band input/output access to each memory module. At the same time, space and signal path length considerations call for a small footprint on the ceramic or other substrate which carries the input/output signal lines to the memory modules. Stacking the memory modules in three dimensions can provide a small footprint, but a custom design for mechanically supporting and providing unique signal path connections would be cost prohibitive for many applications. Stacking memory components has in the prior art required special hardware, i.e. card on board, metal straps for conductors, or modifications to chip technology. The prior art attempted to develop and manufacture such stacked memories. But these attempts have not been successful in the area of Ball Grid Array type memory or module stacking. This invention is a novel approach to this problem. It allows the memory modules to be stacked and also allows these stacks to be included in Application Specific Integrated Circuit (ASIC) Multi-Chip Modules (MCM's).

SUMMARY OF THE INVENTION

An object of this invention is the provision of a pedestal connector that can be replicated at each level of a three-dimensional stack of modules. Each pedestal connector provides signal paths both common and unique to modules at its level and signal paths that match signal paths from a pedestal connector at the level below with a signal path in a pedestal connector at the level above to provide further unique paths.

Another object of this invention is the provision of a pedestal connector that is economical to produce and to use.

Briefly, this invention contemplates the provision of a three-dimensional memory module in which a repetitively used pedestal connector provides signal paths unique and common to the module at its level and signal paths from the level below unique to and common to modules at levels above. In order to provide a unique signal path from a substrate to each memory module, while using identical pedestal connectors at each level, signal lines are skewed from where they enter the bottom surface of the pedestal connector to where they exit the top surface. For example, each input in a line of inputs is connected to a matching line of outputs, but with a shift of one position between input and output.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

Figure 1:
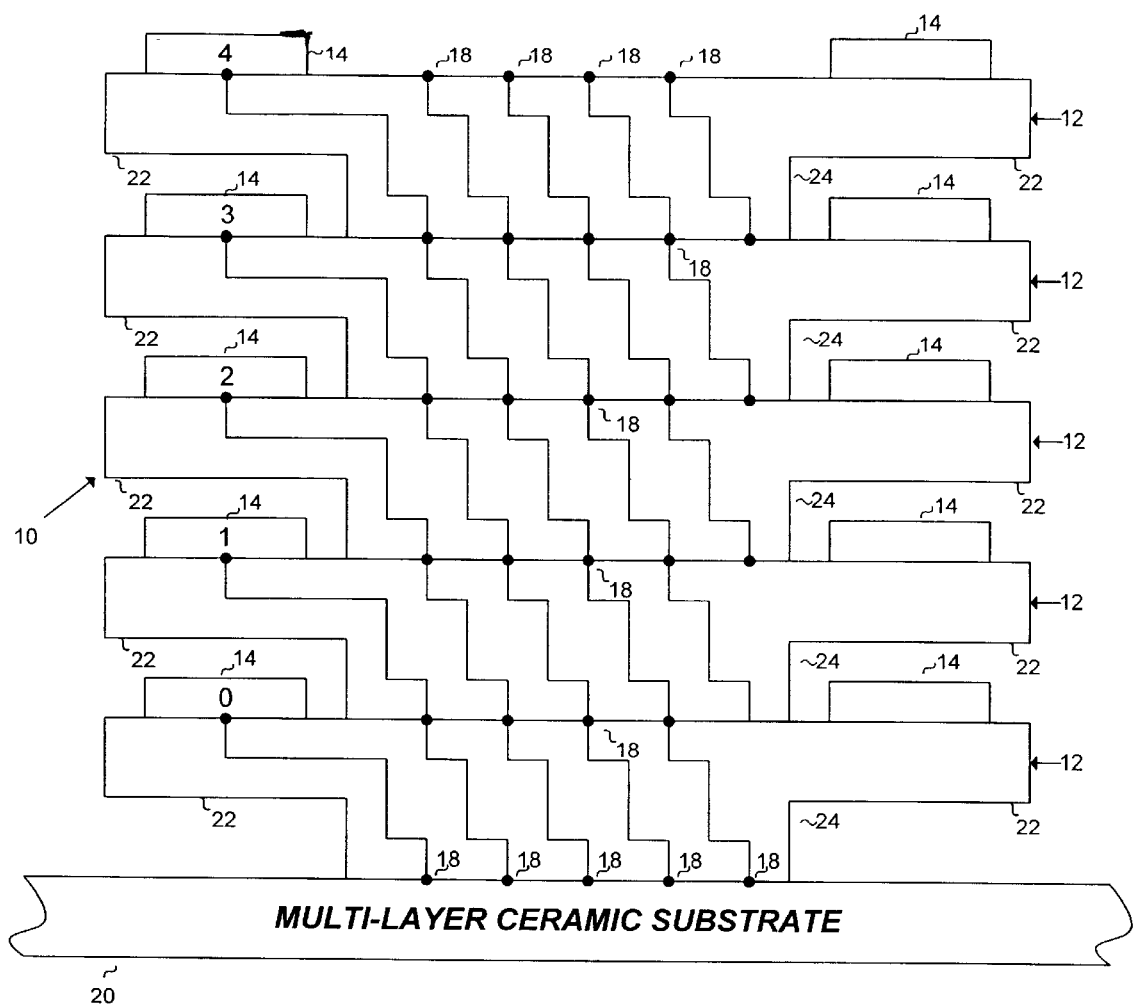
FIG. 1 is a schematic diagram of one embodiment of the invention.
Figure 3:
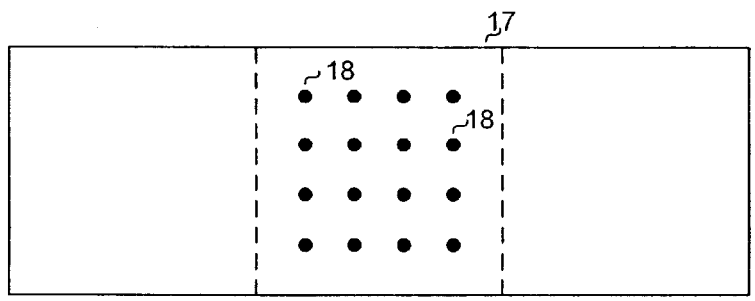
FIG. 3 is a plan view of the pedestal connector shown in FIG. 2.
Figure 2:
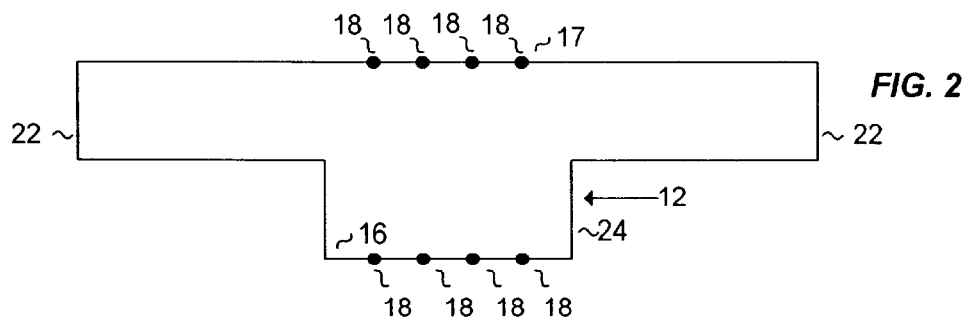
FIG. 2 is a side view of one embodiment of a pedestal connector used in FIG. 1.

Referring now to FIGS. 1, 2 and 3 of the drawings, FIG. 1 shows a three-dimensional carrier, indicated by the general reference number 10. It is comprised of five pedestal connectors 12, shown individually in FIGS. 2 and 3, and ten memory modules 14. The lower surface 16 and upper surface 17 of each pedestal connector has the same dense grid array of connector pads 18, indicated as dots in the drawing. The connector pads 18 of the bottom pedestal connector are connected to a matching array of pads on a substrate 20. Obviously, a three-dimensional carrier 10 in accordance with the teachings of this invention may include more or fewer memory modules than the ten shown with a corresponding increase or decrease in the number of pedestal connectors and is suitable for use with electronic modules other than memory modules. Modules could be attached above or below on the substrates. Each pedestal connector is generally "T" shaped, with arms 22 cantilevered from either side of a pedestal core 24. In this example, the arms are spaced apart so that a memory chip 14 (or other electronic module) can be mechanically and electrically connected to the upper surface of each of the arms 22, allowing some air space for cooling.

The exemplary five signal lines (e.g. memory chip select lines) shown in FIG. 1 represent signal lines that are respectively unique to the memory chips 0, 1, 2, and 3 on the left hand side of FIG. 1. Signal lines unique to a particular memory chip are created by skewing the conductor paths between the input connector pads 18 at the bottom of each pedestal and what would be the corresponding connector pad on the top surface of that pedestal connector. The paths, as shown in FIG. 1, are a diagonal pattern from the bottom surface of the pedestal where signal connections are made from the substrate, or from a preceding pedestal, to the top surface of the pedestal where connections are made to the bottom of the next pedestal in the stack. In this manner, all the pedestal connectors can be identical while unique signal paths are formed to each memory chip in the three-dimensional memory array. In this example, the line of connector pads at the bottom surface of each pedestal connector is connected to a pad at the top surface shifted one position to the left. The leftmost path at each level branches into the arm of the pedestal connector to provide a unique signal path to the module at that level.

Figure 4:
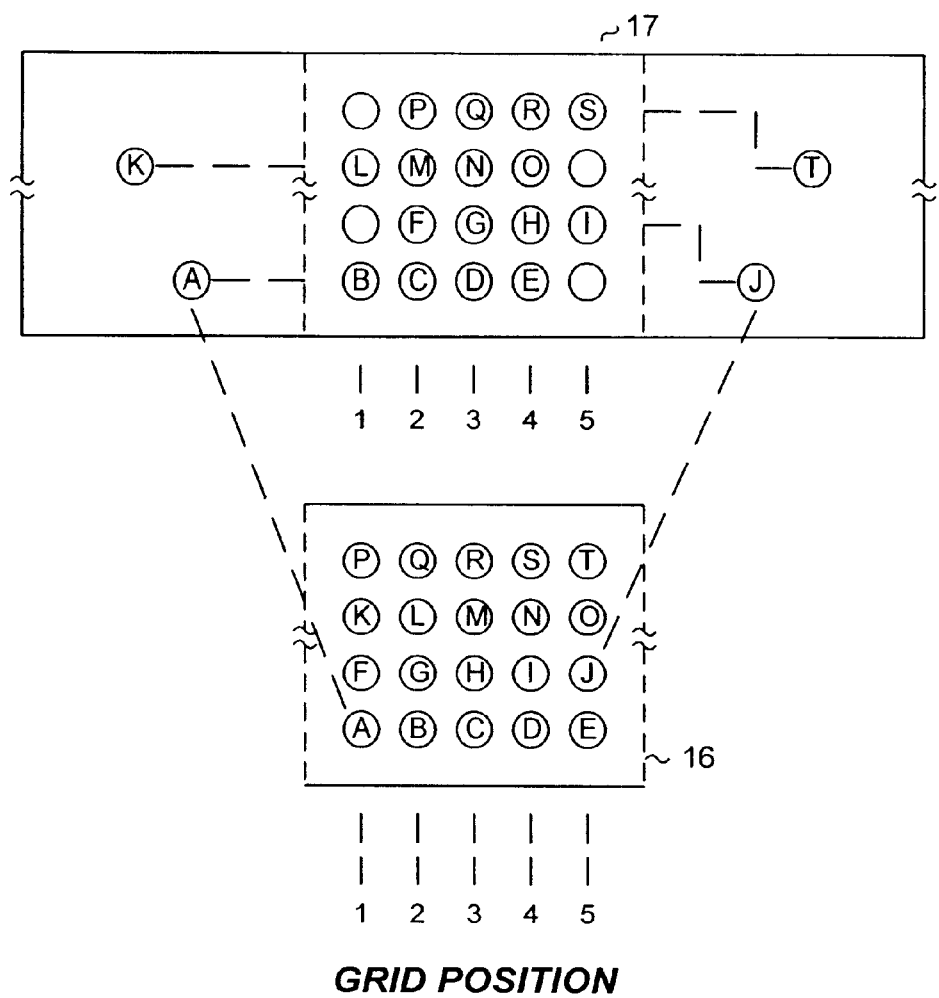
FIG. 4 is a schematic diagram to illustrate the three-dimensions in which connections are made.

Referring now to FIG. 4, it will be appreciated that connector paths are formed in three dimensions. FIG. 4 shows an exemplary input pattern on the bottom surface of a pedestal connector with corresponding identical output pattern on its upper surface. The input pattern on the lower surface repeats itself on the upper surface. But, as previously explained, the pattern on the lower surface 16 is not connected on a one-to-one basis to the pattern on the top surface 17. To form unique conductive paths to the memory modules 14, the upper and lower patterns are connected so that there is an offset between the output and the input that allows one unique conductive path to branch in a pedestal connector to a module attached thereto. For example, each conductive path for the row of conductors, which is labeled A through E, is skewed one grid position from right to left. The skewed path connects pad B in position 2 on the bottom surface to position 1 on the top surface. In the next row, labeled F through I, each conductive path for the row is skewed from left to right. Such patterns may be repeated as often as necessary to provide sufficient unique connection paths as may be required by the respective memory modules 14.

Figure 5:
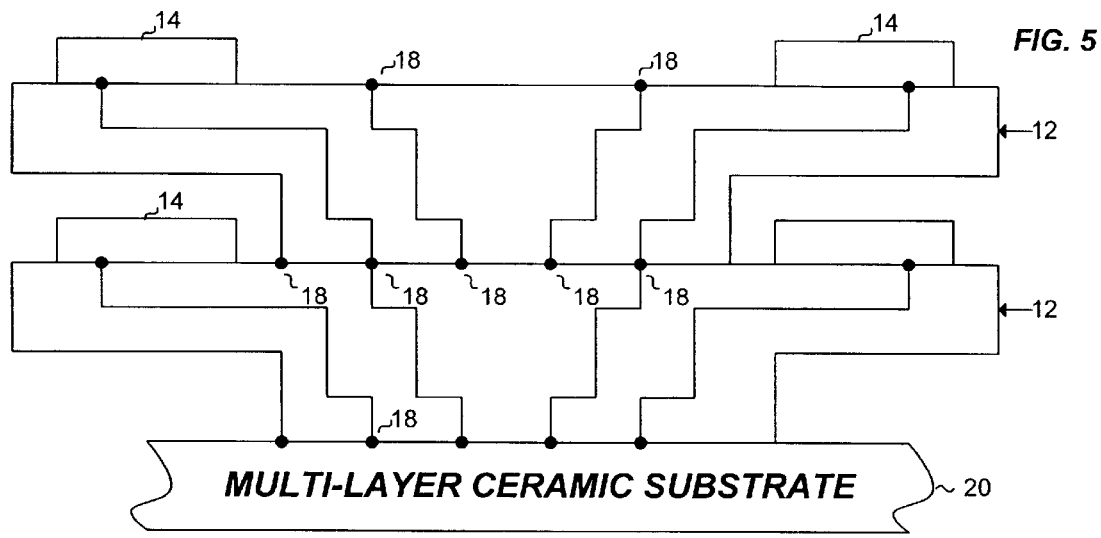
FIG. 5 is a schematic diagram similar to FIG. 1 illustrating an alternate connector pattern.

FIG. 5 illustrates a connection pattern where some of the conductive paths in a given row are skewed from right to left and some of the paths in the same row are skewed from left to right. This pattern is relatively less efficient in terms of the number of unique conductor paths that can be formed in a given pedestal.

Figure 6:
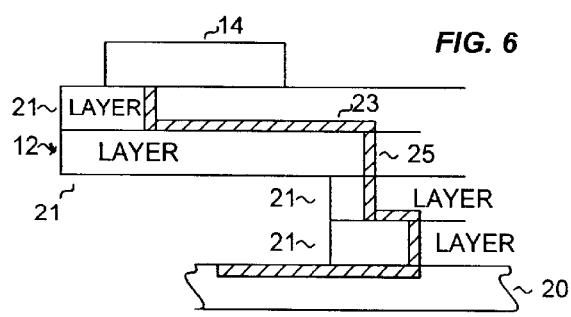
FIG. 6 is a fragmentary, sectional view of the conductor paths implemented in a multi-layer ceramic module technology.

The pedestal connector is preferably implemented by means of the technology known as multi-layer ceramic module technology. FIG. 6 shows a typical implementation, where the horizontal conductors 23 are formed on the surface of the ceramic layers 21, and the vertical conductors 25 are formed by interconnected vias in the layers. The pedestal may be connected to the substrate 20, to the modules 14 and to each other by any suitable technology, such as micro-ball technology.

Figure 9:
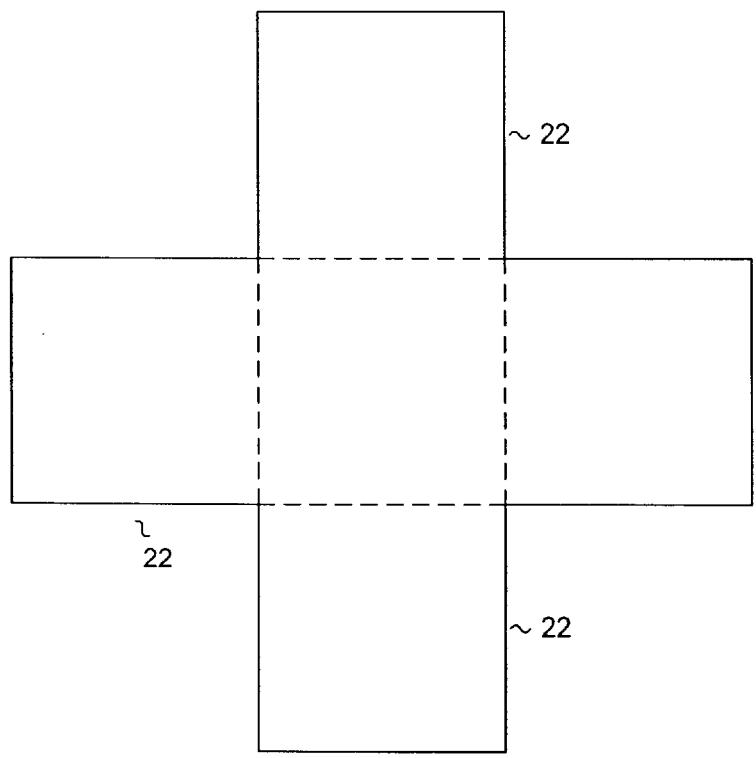
FIG. 9 is a plan view of the pedestal connector shown in FIG. 8.
Figure 8:
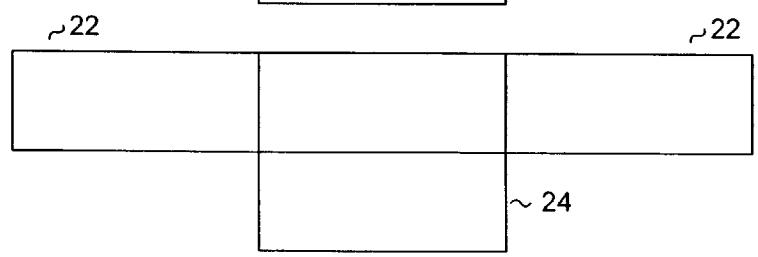
FIG. 8 is a side view of still another embodiment of a pedestal connector.
Figure 7:
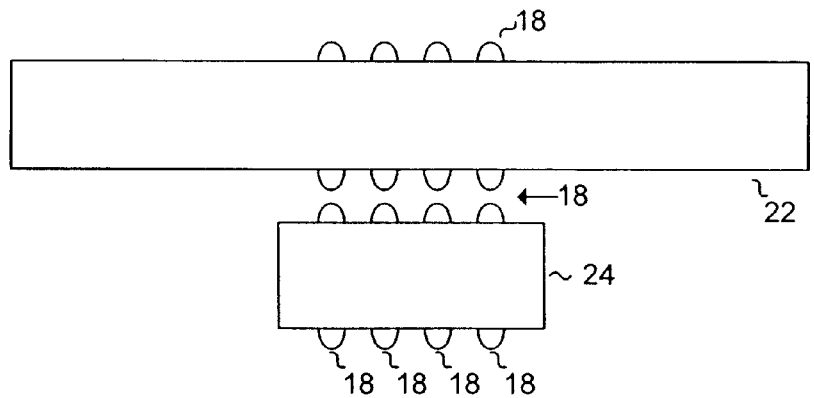
FIG. 7 is a side view of another embodiment of a pedestal connector.

Preferably, the "T" shaped module shown in FIGS. 1–3 is fabricated as a single piece, as this will reduce the number of parts and thus reduce the costs. However, as illustrated in FIG. 7, the module arms 22 and core 24 could be fabricated as separate pieces and connected together to form a pedestal connector. FIGS. 8 and 9 illustrate another embodiment of the invention in which the pedestal connector has four arms 22. Here it should be noted that the connector patterns may be skewed not only in a series of x-y planes as illustrated in the previous Figures, but also in the third dimension, or z plane.

Figure 10:
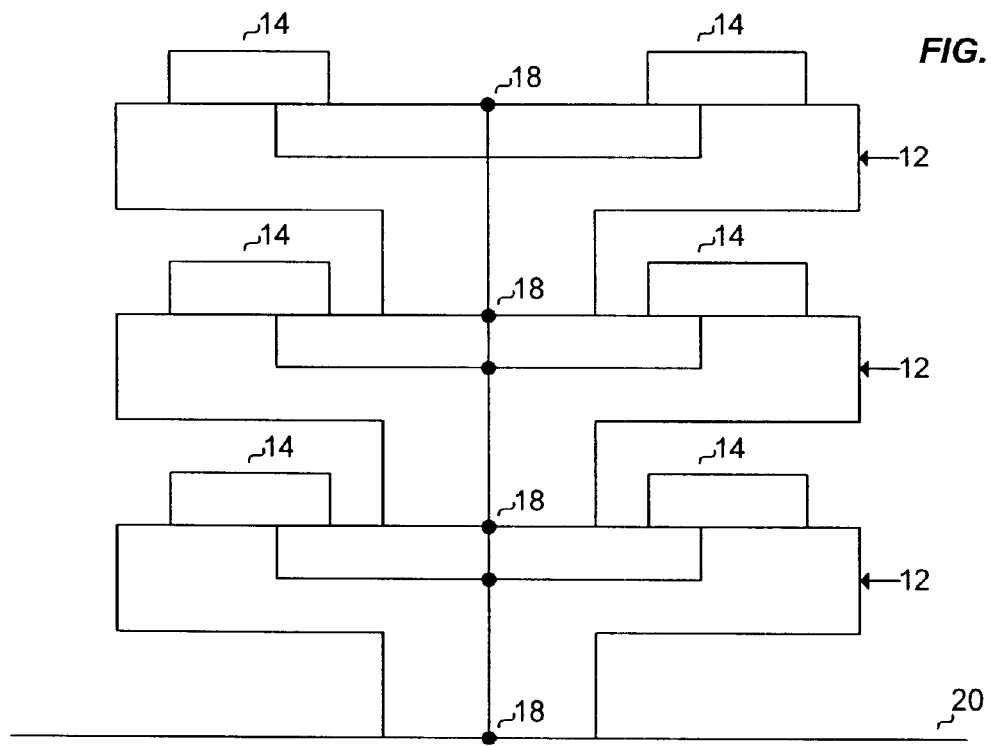
FIG. 10 illustrates a conductor path that can provide a common connection to all modules.

As illustrated in FIG. 10, for conductor paths that are common to a plurality of modules, such a conductive path for powering the modules 14, the corresponding inputs and outputs can be connected in a straight line.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A three-dimensional array of modules comprising in combination:

a plurality of "T" shaped pedestal connectors;

each of said pedestal connectors comprised of a conductor core and a plane including a cantilevered arm extending from said conductor core;

each of said pedestal connectors having an input grid array on a lower surface of said conductor core and a corresponding output grid array on an upper surface of said conductor core;

said plurality of pedestal connectors stacked one on top of another with the output grid array of one pedestal connector connected to the input grid array of the next pedestal connector by solder balls;

conductive paths formed in each pedestal connector between its input grid array and its output grid array;

said conductive paths skewed from input grid array to output grid array to form a plurality of unique paths from the input grid of the lowest pedestal connector in the stack to respective branch conductive paths extending into said plane.

2. A three-dimensional array of modules comprising in combination:

a plurality of "T" shaped pedestal connectors;

each of said pedestal connectors comprised of a conductor core and a plane including a cantilevered arm extending from said conductor core;

each of said pedestal connectors having an input grid array on a lower surface of said conductor core and a corresponding output grid array on an upper surface of said conductor core;

said plurality of pedestal connectors stacked one on top of another with the output grid array of one pedestal connector connected to the input grid array of the next pedestal connector;

conductive paths formed in each pedestal connector between its input grid array and its output grid array;

said conductive paths skewed in a zig-zag pattern formed of a series of horizontal conductive paths interconnected by vertical vias from input grid array to output grid array to form a plurality of unique paths from the input grid of the lowest pedestal connector in the stack to respective branch conductive paths extending into said plane.

3. A three-dimensional array of modules comprising in combination:

a plurality of "T" shaped pedestal connectors;

each of said pedestal connectors comprised of a conductor core and a plane including a cantilevered arm extending from said conductor core;

each of said pedestal connectors having an input grid array on a lower surface of said conductor core and a corresponding output grid array on an upper surface of said conductor core;

said plurality of pedestal connectors stacked one on top of another with the output grid array of one pedestal connector connected to the input grid array of the next pedestal connector;

conductive paths formed in each pedestal connector between its input grid array and its output grid array; said conductive paths skewed from input grid array to output grid array to form a plurality of unique paths from the input grid of the lowest pedestal connector in the stack to respective branch conductive paths extending into said plane.

\* \* \* \* \*